(12) United States Patent
Vajana et al.

(10) Patent No.: US 6,528,885 B2
(45) Date of Patent: Mar. 4, 2003

(54) ANTI-DECIPHERING CONTACTS

(75) Inventors: Bruno Vajana, Bergamo (IT); Matteo Patelmo, Trezzo Sull'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/968,682

(22) Filed: Oct. 1, 2001

(65) Prior Publication Data

US 2002/0079564 A1 Jun. 27, 2002

(30) Foreign Application Priority Data

Oct. 2, 2000 (EP) .............................. 00830646

(51) Int. Cl.⁷ .................... H01L 23/48; H01L 23/52; H01L 29/40
(52) U.S. Cl. .................... 257/758; 257/750; 437/637
(58) Field of Search ................ 257/750, 758; 438/622, 629, 637

(56) References Cited

U.S. PATENT DOCUMENTS

| | | | | |
|---|---|---|---|---|
| 5,336,624 A | | 8/1994 | Walden | ............... 437/29 |
| 5,629,236 A | * | 5/1997 | Wada et al. | |
| 5,789,313 A | * | 8/1998 | Lee | |
| 5,909,058 A | * | 6/1999 | Yano et al. | |
| 5,930,663 A | | 7/1999 | Baukus et al. | ............... 438/598 |
| 5,946,563 A | * | 8/1999 | Uhara et al. | |
| 5,990,988 A | * | 11/1999 | Hanihara et al. | |
| 6,069,036 A | * | 5/2000 | Kim | |
| 6,380,087 B1 | * | 4/2002 | Gupta et al. | |

FOREIGN PATENT DOCUMENTS

WO     98/57373     12/1998     ........... H01L/27/02

* cited by examiner

*Primary Examiner*—Sheila V. Clark
(74) *Attorney, Agent, or Firm*—Lisa K. Jorgenson; Allen, Dyer, Doppelt, Milbrath & Gilchrist, P.A.

(57) ABSTRACT

A method of making an integrated circuit that is resistant to an unauthorized duplication through reverse engineering includes forming a plurality of false contacts and/or false interconnection vias in the integrated circuit. These false contacts and/or false interconnection vias are connected as true contacts and true interconnection vias by lines patterned in a metallization layer deposited over an insulating dielectric layer or multilayer through which the true contacts and/or the true interconnection vias are formed. False contacts and false vias extend in the respective dielectric layers or multilayers to a depth insufficient to reach the active areas of a semiconductor substrate for false contacts, or to a depth insufficient to reach a layer of conductive material below the dielectric layers or multilayers for false interconnection vias.

28 Claims, 3 Drawing Sheets

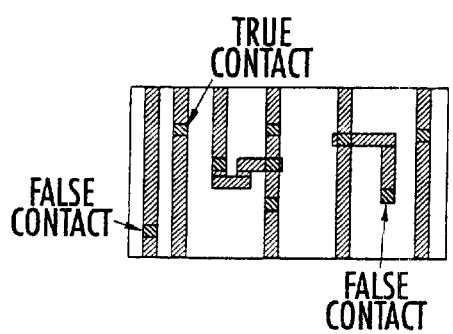
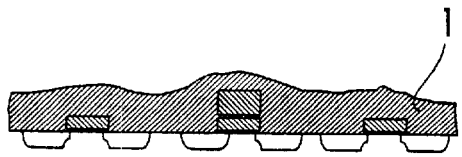
FIG. 1.
FIG. 2.
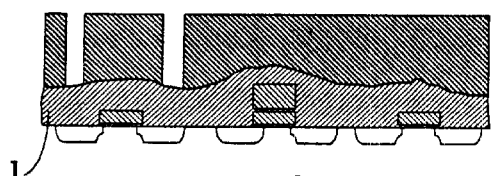
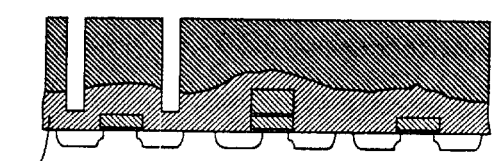
FIG. 3.
FIG. 4.
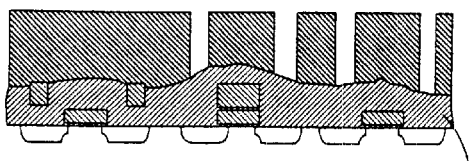
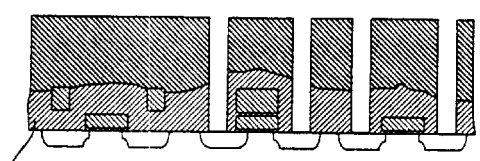
FIG. 5.
FIG. 6.

though reverse engineering techniques that include microscopic inspection of the integrated circuit being duplicated. Making it difficult to duplicate integrated circuits is applicable whether the devices are intended for applications in which it is particularly important to keep stored data undecipherable, or whether the devices result from a long and expensive development process.
ANTI-DECIPHERING CONTACTS

Field of the Invention

The present invention relates to integrated circuits, and more particularly, to a complex device that is hard to duplicate.

Background of the Invention

The large diffusion of the so-called "smart-cards" for applications such as credit cards, medical record memory cards, electronic driver licenses, etc. require that data stored in such integrated devices be very secure. Both hardware and software used in these devices must be designed and formed in such a way as to satisfy this need of protection.

Sophisticated "reverse engineering" techniques are known and used, often illegally, to duplicate integrated circuits from commercially available samples. This causes a great economic loss to the company that designed them.

It is important to make if difficult to duplicate such integrated circuits, even through reverse engineering techniques that include microscopic inspection of the integrated circuit being duplicated. Making it difficult to duplicate integrated circuits is applicable whether the devices are intended for applications in which it is particularly important to keep stored data undecipherable, or whether the devices result from a long and expensive development process.

Making the hardware system secure may represent an insuperable obstacle to the identification of working codes, i.e., hardware protection in addition to the software ciphering of stored data. Known reverse engineering techniques can be used to duplicate an integrated circuit when inspected by an optical or electronic microscope.

SUMMARY OF THE INVENTION

In view of the foregoing background, an object of the present invention is to make it very difficult to reverse engineer integrated circuits, such as smart cards, using visual and even destructive inspection techniques.

This and other objects, advantages and features according to the present invention are provided by anti-deciphering contacts for integrated devices in which a plurality of false contacts and/or false interconnection vias are formed in a way to make them totally indistinguishable from true contacts and true interconnection vias, even by a destructive inspection of the device. False contacts and false interconnection vias are connected like true contacts and true interconnections vias by metal lines defined in a respective layer of conducting material.

True contacts and true interconnection vias extend throughout the entire thickness of an insulating dielectric layer or multilayer to reach and establish electrical paths with the respective active area in the case of contacts, or with another conducting element of the integrated structure in the case of interconnection vias. False contacts and false interconnection vias are formed using a dedicated mask, complementary to the mask of true contacts or true interconnection vias, and extend only partially through the thickness of the respective insulating dielectric layer or multilayer. The false contacts and false interconnection vias thus remain as electrically isolated "appendices" without any function.

False contacts and false vias in accordance with the present invention do not establish any current path even if they are at the potential of the circuit node to which they are connected through the respective metallization lines that intercept them. The only way of determining their false nature would be to section the device for establishing a path for each contact and each interconnection via, whether it is true or false. This would be a very burdening job requiring someone to buy and sacrifice a very large number of identical devices.

BRIEF DESCRIPTION OF THE DRAWINGS

FIG. 1 is a generic layout portion of a patterned metallization layer showing that true contacts and false contacts of the device are not distinguishable from each other according to the present invention.

FIGS. 2 to 8 schematically show the formation of false contacts according to the present invention.

DETAILED DESCRIPTION OF THE PREFERRED EMBODIMENTS

The integrated structures of FIGS. 1 to 8 represent a flash memory cell and two transistors. These items are depicted for sample purposes only, and are sufficient for illustrating the technique of the present invention. The scheme of anti-deciphering contacts of the invention may be generally implemented on the entire layout of the integrated circuitry, and even on structures different from the ones depicted in these figures.

Because of the importance of CMOS processes, the invention will be described while referring to typical CMOS processes for forming nonvolatile flash memory devices having contacts made by tungsten plugs. Of course, this particular process condition is not essential, as will be apparent to any skilled person. The technique of the invention may be used even if the contacts are directly established by depositing a metallization layer.

A sectional view of a wafer during the fabrication step in which a dielectric layer 1 is deposited thereon is illustrated in FIG. 1. The dielectric layer 1 is deposited for isolating the previously formed structures. These structures are completely defined integrated functional structures, as depicted in FIG. 2.

At this point, priority may be indifferently given to the formation of true or false contacts that are defined by using respective masks. In the example of FIG. 3, a photoresist mask for false contacts is formed first. As depicted in FIG. 4, an incomplete etching of the insulating dielectric layer 1 is carried out through the openings of the mask. The etching is stopped after a certain etching time that is sufficient for etching no more than a certain fraction of the thickness of the dielectric layer 1.

After having removed the photoresist mask of false contacts, a new photoresist mask for true, i.e., functional contacts of the integrated structures, is formed and defined, as depicted in FIG. 5. Through the openings of this mask the true contacts are opened by etching to the active areas of the semiconductor, as depicted in FIG. 6, according to well known and commonly used etching techniques.

Figure 7:
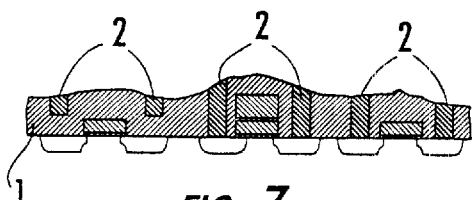

After having removed the second mask relative to the true contacts, the deposition and the etch-back of tungsten are carried out. This forms tungsten plugs both in the openings of true contacts as well as in the holes of false contacts formed in the dielectric layer 1. A sectional view of the wafer after deposition and etch-back of the tungsten plugs 2 is depicted in FIG. 7.

According to common manufacturing techniques, a metal layer is then deposited onto the whole surface of the wafer and, through a suitable mask, the conductive lines are defined according to a layout as the one depicted in FIG. 1.

Figure 8:
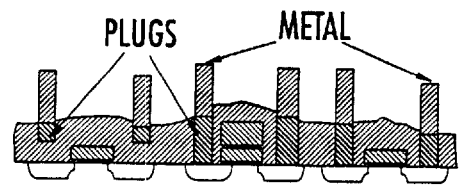

As depicted in FIG. 8, the defined lines intercept all the tungsten plugs, including those corresponding to the functional contacts of the integrated structures as well as those corresponding to false contacts. Naturally the intercepting of electrically isolated tungsten plugs for the false contacts will not have any effect on the operation of the integrated circuit that is defined by the current paths which the tungsten plugs of true contacts belong to.

Through an inspection of the patterned metal (FIG. 1) it is not possible to establish which contact is a true contact and which one is a false contact. Only the presence of contacts can be detected. On the other hand, this doubt may be resolved for each contact location by sectioning the dice to establish whether the particular contact is true or false. It is evident that this would be very hard to do because of the very high cost that is implied.

The present invention can be applied in a peculiarly convenient way in advanced CMOS processes in which local interconnections, or more briefly local interconnect layers (LIL), are used to form electrical connections or interconnection vias between conductive elements defined on different levels and contacts with the active areas.

In these processes the contacts on the active areas, and eventually the interconnection vias, are formed in two steps. A first masking step defines the contacts through a first dielectric layer. The lower portion of the true contacts is formed. A second masking step defines the interconnection vias and at the same time the upper portion of the contacts on active areas throughout the second dielectric layer.

By this second masking step, already contemplated in the normal process, false contacts and false vias are also defined according to the present invention. This is in addition to completing the true contacts on the active areas and the true vias on the patterned polysilicon layer. The true contacts on the active areas are coincident with the lower portions of the contacts formed with the first masking step.

The significant steps of a manufacturing process of an integrated circuit, according to a preferred embodiment of the present invention, are depicted in FIGS. 9 to 15. This embodiment concerns a so-called local interconnect layer (LIL) process for forming interconnection vias.

The invention is applicable to a generic CMOS process for manufacturing general purpose integrated circuits, memory devices, gate arrays and logic circuitry, as well as to any other manufacturing process of integrated devices. The figures are schematic partial sections of the device and are not to scale.

Active devices are formed on a semiconductor substrate according to a conventional process. A gate oxide layer is formed on pre-defined active areas of transistors which will eventually become memory cells. A first polysilicon layer is deposited on the wafer surface, doped and patterned for forming the gates of transistors and eventually the floating gates of memory cells. In forming floating gate memory cells, a dielectric interpoly layer and a second polysilicon layer are also formed and patterned according to a normal fabrication process.

The figures depict the cross section along a section line passing through the drain and the source region of a transistor identified by the reference numeral 100. The gate oxide 101 and the polysilicon gate 102 formed thereon are clearly recognizable. After formation of the active elements of the device, a first dielectric layer 103 is formed. This layer is typically formed by a chemical vapor deposition (CVD) technique. Preferably, if the device includes nonvolatile memory cells, the layer 103 is a BPSG, i.e., a silicon oxide doped with phosphorous and boron.

Figure 9:
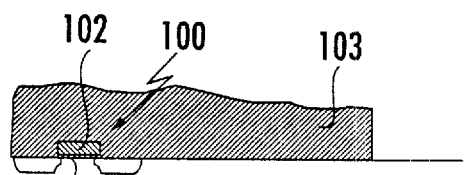
FIGS. 9 to 15 illustrate the sequence of process steps for forming false contacts in a local interconnect layer (LIL) process.
Figure 10:
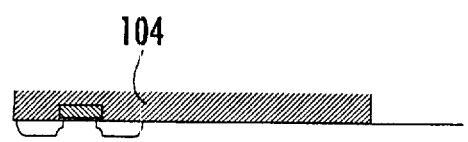

Nevertheless, depending on the specific application, other dielectrics can be used, such as undoped oxides or PSG or oxynitrides. In any case, the layer 103 must be formed by a material and a technique that provides for enhanced conformability and insulating characteristics typical of any pre-metallization layer. The device obtained at the end of this step is depicted in FIG. 9. As depicted in FIG. 10, this first dielectric layer surface is preferably planarized. This minimizes mechanical stresses in the layers that will be formed successively thereon, and in particular, in the local interconnection layer.

Planarization is preferably carried out by a CMP technique, i.e., by chemical mechanical polishing or by lapping the surface by a chemical mechanical process. Of course, the planarization may be done by any suitable alternative technique, such as by thermal reflow, for example. This step remains optional even though it is preferred. For instance, if the first dielectric layer is sufficiently flat, planarization may not be required altogether. As depicted in FIG. 10, the planarization partially removes the previously deposited dielectric layer 103. Whether planarization is achieved or not, the final thickness of the first dielectric layer 104 is preferably between 100 and 200 nm.

Figure 11:
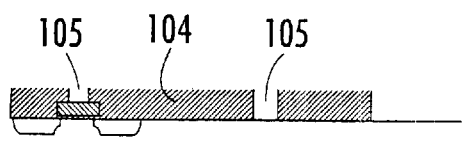
Figure 12:
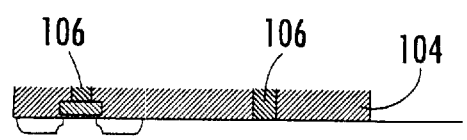

As depicted in FIG. 11, openings are defined through the dielectric layer 104 by a first masking step and by a subsequent etching. These openings 105 are defined only in correspondence to contact locations that need to be formed with active areas and with local interconnection vias. Typically, as depicted in the figure, the openings are for active areas on the silicon substrate and for the polysilicon gate structures. As stated above in accordance with the present invention, in this first masking and etching step locations in which false contacts and false vias will be formed are not defined. Subsequently, the openings are filled according to any known technique for the formation of the tungsten plugs.

According to the LIL technique, certain filled openings make up the local interconnection vias. The tungsten filler is identified by the reference numeral 106 in FIG. 12. According to a preferred embodiment, a barrier layer composed of stacked layers of titanium and titanium nitride (Ti/TiN) is deposited first. Successively, tungsten is deposited and etched back by a CMP technique in order to leave the tungsten only inside the openings of the contacts and of the vias.

Figure 13:
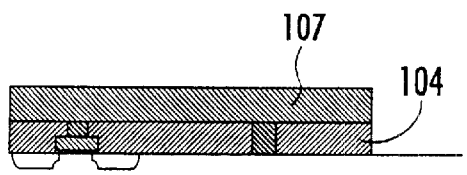
Figure 14:
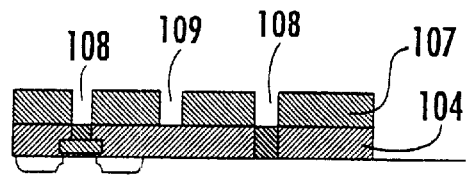

According to the LIL technique, a second dielectric layer 107 is deposited on the wafer as depicted in FIG. 13. This second dielectric layer is preferably formed by a CVD technique, and preferably includes TEOS (tetraethylorthosilicate). However, the layer 107 may include a different dielectric material, for example, such as a different oxide that may or may not be doped, or even an oxynitride provided that it has appropriate chemical-physical and morphological characteristics to ensure a good electrical insulation of the underlying integrated structure. If necessary, even this second dielectric layer is planarized by any of the known techniques. The final thickness of this second dielectric layer 107 may be generally between 200 and 1500 nm.

According to the present invention a second mask is formed on the wafer surface, which is not shown in the figures, for defining the contacts and the interconnection vias according to the local interconnect layer technique. The openings in the second dielectric layer 107 are defined based upon the opening in the second mask. These openings correspond to the locations of the active or real contacts and to the real vias, as well as corresponding to the false contacts and the false vias.

The second dielectric layer 107 is eventually etched to form a first plurality of openings 108 coincident with the previously formed tungsten plugs, and a second plurality of openings 109 that practically end at the underlying first dielectric layer 104. The openings 109 thus formed will define as many false contacts and false vias.

Figure 15:
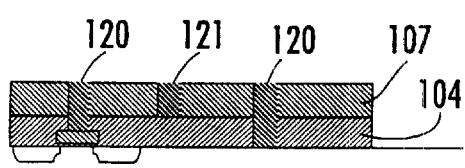

As depicted in FIG. 15, the openings 108 and 109 are filled with tungsten to form plugs 120 and 121 according to the previously described technique of deposition and etchback. In this preferred embodiment of the present invention, it is advantageously not necessary to use an additional mask dedicated to the formation of false contacts and false vias, but it is sufficient to modify the mask that is already used in the process for opening contacts and vias in the second dielectric layer.

The formation of false contacts and false vias is inexpensive and relatively straightforward because the etching can be terminated automatically on the first dielectric layer. Although the invention has been described by referring to the formation of contacts and vias between a local interconnect layer and an underlying conductive material, such as a polysilicon gate, it may be implemented even when forming vias between any two metal levels.

Figure 16:
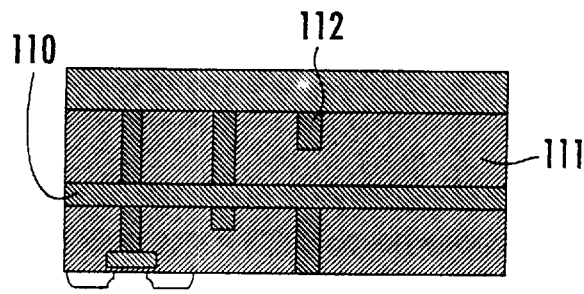
FIGS. 16 and 17 depict an application of the invention for forming false interconnection vias between conductive structural elements of an integrated circuit defined in the nth and the n+1$^{th}$ metallization levels.
Figure 17:
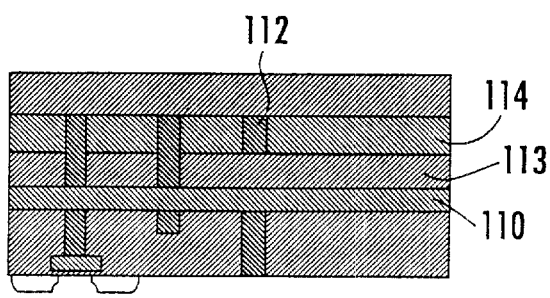

FIGS. 16 and 17 depict a possible application of the present invention to vias between the. $N^{th}$ and the $N+1^{th}$ metals. In the sample illustration, the first and the second metallization layers are depicted. In the figures a first metal 110, which is patterned as conductive lines, may be a conventional layer of aluminum or alloy thereof. The integrated device may even use LIL interconnection vias, typically filled with tungsten, as the ones already described in relation to the preceding FIGS. 9 to 15.

According to the embodiment depicted in FIG. 16, an intermetal dielectric layer 111 is formed by CVD. This first intermetal dielectric 111 is preferably a TEOS and may have a thickness between 500 and 1000 nm. The thickness of the dielectric is correlated to the thickness of the metal layers and must be sufficient to make negligible eventual capacitive couplings. According to the present invention false vias, labeled with the reference numeral 112, are formed in the same manner as already described in relation to FIGS. 2 to 8.

In another embodiment depicted in FIG. 17, the intermetal dielectric is formed by at least two superimposed layers. In this case, a process similar to the one described with reference to FIGS. 9 to 15 is advantageously followed. Dielectric layers are typically formed by a CVD deposition followed by an eventual planarization step. Typically, a first layer 113 is formed by an oxide formed by a high density plasma (HDP) deposition technique, while the second dielectric layer 114 is preferably a TEOS. The total thickness of the two stacked layers may range between 600 and 1200 nm.

False vias 112 according to the invention are formed only in the second dielectric layer. By forming false vias between any or all adjacent metals and false contacts, permanently stored data and/or the characterization of an integrated circuit is rendered practically undecipherable through reverse engineering inspection techniques.

That which is claimed is:

1. A method of making an integrated circuit that is resistant to an unauthorized duplication through reverse engineering, the method comprising:

forming a plurality of dielectric layers adjacent a substrate;

forming at least one interconnect layer between the plurality of dielectric layers;

forming at least one true vertical interconnection extending from the substrate and through the plurality of dielectric layers, the at least one true vertical interconnection comprising a plurality of aligned portions connected together for forming at least one functional interconnection; and forming at least one false vertical interconnection extending in the plurality of dielectric layers and comprising a plurality of aligned portions with at least one discontinuity therein for forming at least one non-functional interconnection.

2. A method according to claim 1, wherein the at least one interconnect layer comprises patterned lines connected to the at least one true vertical interconnection and to the at least one false vertical interconnection.

3. A method according to claim 1, wherein the at least one false vertical interconnection extends from the substrate.

4. A method according to claim 1, wherein the plurality of dielectric layers comprise at least one of silicon oxide, silicon oxide doped with phosphorous and boron, oxynitride and tetraethylorthosilicate.

5. A method according to claim 1, wherein the at least one true and false vertical interconnections comprise at least one of polysilicon, silicide, aluminum, titanium, iridium, rhodium, platinum, gold, palladium, zirconium, tantalum, niobium and alloys thereof.

6. A method according to claim 1, wherein the substrate comprises at least one active region comprising a plurality of CMOS transistors therein.

7. A method according to claim 1, wherein the integrated circuit is configured as a contactless chip card.

8. A method of making an integrated circuit that is resistant to an unauthorized duplication through reverse engineering, the method comprising:

forming a substrate comprising at least one active region and at least one non-active region therein;

forming a first dielectric layer adjacent the substrate;

forming an interconnect layer on the first dielectric layer;

forming a second dielectric layer on the interconnect layer;

forming at least one true vertical interconnection extending from the at least one active region and through the first and second dielectric layers, the at least one true vertical interconnection comprising a plurality of aligned portions connected together for forming at least one functional interconnection; and forming at least one false vertical interconnection extending in the first and second dielectric layers and comprising a plurality of aligned portions with at least one discontinuity therein for forming at least one non-functional interconnection.

9. A method according to claim 8, wherein the interconnect layer comprises patterned lines connected to the at least one true vertical interconnection and to the at least one false vertical interconnection.

10. A method according to claim 8, wherein the at least one false vertical interconnection extends from the at least one non-active region.

11. A method according to claim 8, wherein the first and second dielectric layers comprise at least one of silicon oxide, silicon oxide doped with phosphorous and boron, oxynitride and tetraethylorthosilicate.

12. A method according to claim 8, wherein the at least one true and false vertical interconnections comprise at least one of polysilicon, silicide, aluminum, titanium, iridium, rhodium, platinum, gold, palladium, zirconium, tantalum, niobium and alloys thereof.

13. A method according to claim 8, wherein the at least one active region comprising a plurality of CMOS transistors therein.

14. A method according to claim 8, wherein the integrated circuit is configured as a contactless chip card.

15. An integrated circuit comprising:
 a substrate;
 a plurality of dielectric layers adjacent said substrate;
 at least one interconnect layer between adjacent dielectric layers;
 at least one true vertical interconnection extending from said substrate and through said plurality of dielectric layers, said at least one true vertical interconnection comprising a plurality of aligned portions connected together for defining at least one functional interconnection; and
 at least one false vertical interconnection extending in said plurality of dielectric layers and comprising a plurality of aligned portions with at least one discontinuity therein for defining at least one non-functional interconnection.

16. An integrated circuit according to claim 15, wherein said interconnect layer comprises patterned lines connected to said at least one true vertical interconnection and to said at least one false vertical interconnection.

17. An integrated circuit according to claim 15, wherein said at least one false vertical interconnection extenda fromsaid substrate.

18. An integrated circuit according to claim 15, wherein said plurality of dielectric layers comprise at least one of silicon oxide, silicon oxide doped with phosphorous and boron, oxynitride and tetraethylorthosilicate.

19. An integrated circuit according to claim 15, wherein said at least one true and false vertical interconnections comprises at least one of polysilicon, silicide, aluminum, titanium, iridium, rhodium, platinum, gold, palladium, zirconium, tantalum, niobium and alloys thereof.

20. An integrated circuit according to claim 15, wherein said substrate comprises at least one active region comprising a plurality of CMOS transistors therein.

21. An integrated circuit according to claim 15, wherein the integrated circuit is configured as a contactless chip card.

22. An integrated circuit comprising:
 a substrate comprising at least one active region and at least one non-active region therein;
 a first dielectric layer adjacent said substrate;
 an interconnect layer on said first dielectric layer;
 a second dielectric layer on said interconnect layer;
 at least one true vertical interconnection extending from said at least one active region and through said first and second dielectric layers, said at least one true vertical interconnection comprising a plurality of aligned portions connected together for defining at least one functional interconnection; and
 at least one false vertical interconnection extending in said first and second dielectric layers and comprising a plurality of aligned portions with at least one discontinuity therein for defining at least one non-functional interconnection.

23. An integrated circuit according to claim 22, wherein said interconnect layer comprises patterned lines connected to said at least one true vertical interconnection and to said at least one false vertical interconnection.

24. An integrated circuit according to claim 22, wherein said at least one false vertical interconnection extends from said at least one non-active region.

25. An integrated circuit according to claim 22, wherein said first and second dielectric layers comprise at least one of silicon oxide, silicon oxide doped with phosphorous and boron, oxynitride and tetraethylorthosilicate.

26. An integrated circuit according to claim 22, wherein said at least one true and false vertical interconnections comprise at least one of polysilicon, silicide, aluminum, titanium, iridium, rhodium, platinum, gold, palladium, zirconium, tantalum, niobium and alloys thereof.

27. A An integrated circuit according to claim 22, wherein said at least one active region comprising a plurality of CMOS transistors therein.

28. An integrated circuit according to claim 22, wherein the integrated circuit is configured as a contactless chip card.

* * * * *

UNITED STATES PATENT AND TRADEMARK OFFICE
CERTIFICATE OF CORRECTION

PATENT NO. : 6,528,885 B2
DATED : March 4, 2003
INVENTOR(S) : Bruno Vajana and Matteo Patelmo It is certified that error appears in the above-identified patent and that said Letters Patent is hereby corrected as shown below:

<u>Title page,</u>
Item [56], delete:
"U.S. PATENT DOCUMENTS
5336624 A    8/1994    Walden ................. 437/29
5629236 A    5/1997    Wada et al.
5789313 A    8/1998    Lee
5909058 A    6/1999    Yano et al.
5930663 A    7/1999    Baukus et al ....... 438/598
5946563 A    8/1999    Uhara et al.
5990988 A    11/1999   Hanihara et al.
6069036 A    5/2000    Kim.
6380087 A    4/2002    Gupta et al.

FOREIGN PATENT DOCUMENTS
WO 98/57373   12/1998 .................. H01L/27/02"

Insert:
-- U.S. PATENT DOCUMENTS
5336624 A    8/1994    Walden ……… ……….437/29
5629236 A    5/1997    Wada et al. ……………..438/607
5789313 A    8/1998    Lee ………….. ……….438/599
5909058 A    6/1999    Yano et al. …………… 257/712
5930663 A    7/1999    Baukus et al. ………… 438/598
5946563 A    8/1999    Uhara et al. …………... 438/183
5990988 A    11/1999   Hanihara et al. ……….. 349/48
6069036 A    5/2000    Kim …………………...438/238
6380087 A    4/2002    Gupta et al. …………... 438/692

FOREIGN PATENT DOCUMENTS
WO 98/57373   12/1998 ………... H01L/27/02 --

<u>Column 1,</u>
Line 21, delete "if difficult" insert -- it difficult --

<u>Column 5,</u>
Line 35, delete "the." insert -- the --

UNITED STATES PATENT AND TRADEMARK OFFICE
CERTIFICATE OF CORRECTION

PATENT NO. : 6,528,885 B2
DATED : March 4, 2003
INVENTOR(S) : Bruno Vajana and Matteo Patelmo It is certified that error appears in the above-identified patent and that said Letters Patent is hereby corrected as shown below:

<u>Column 7,</u>
Lines 40-41, delete "extenda fromsaid" insert -- extends from said --

<u>Column 8,</u>
Line 42, delete "A An" insert -- An --

Signed and Sealed this

Second Day of September, 2003

JAMES E. ROGAN
*Director of the United States Patent and Trademark Office*